(12) United States Patent
Mann et al.

(10) Patent No.: US 10,629,602 B2
(45) Date of Patent: Apr. 21, 2020

(54) STATIC RANDOM ACCESS MEMORY CELLS WITH ARRANGED VERTICAL-TRANSPORT FIELD-EFFECT TRANSISTORS

(71) Applicant: GLOBALFOUNDRIES Inc., Grand Cayman (KY)

(72) Inventors: Randy W. Mann, Milton, NY (US); Bipul C. Paul, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/983,627

(22) Filed: May 18, 2018

(65) Prior Publication Data

US 2019/0355730 A1 Nov. 21, 2019

(51) Int. Cl.
*H01L 27/11* (2006.01)
*H01L 29/78* (2006.01)

(52) U.S. Cl.
CPC ...... *H01L 27/1104* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,754,481 B2 | 6/2014 | Masuoka et al. | |
| 9,362,292 B1 * | 6/2016 | Liaw | H01L 27/1104 |
| 9,620,509 B1 | 4/2017 | Pao et al. | |
| 9,711,511 B1 | 7/2017 | Lim et al. | |
| 9,721,957 B2 | 8/2017 | Nakanishi et al. | |
| 9,754,660 B2 * | 9/2017 | Kwon | H01L 27/11 |
| 9,761,662 B1 | 9/2017 | Paul et al. | |
| 9,929,236 B1 | 3/2018 | Paul et al. | |
| 2010/0203714 A1 * | 8/2010 | Masuoka | H01L 21/84 438/586 |

(Continued)

OTHER PUBLICATIONS

Huynh-Bao et al., "A Comprehensive Benchmark and Optimization of 5-nm Lateral and Vertical GAA 6T-SRAMs", IEEE Transactions on Electron Devices, vol. 63, No. 2, Feb. 2016.

(Continued)

*Primary Examiner* — Nishath Yasmeen
(74) *Attorney, Agent, or Firm* — Thompson Hine LLP; Anthony Canale

(57) ABSTRACT

Structures for a static random access memory (SRAM) bitcell and methods for forming a SRAM bitcell. The SRAM includes a storage element with a first pull-up (PU) vertical-transport field-effect transistor (VTFET) having a first bottom source/drain region and a fin projecting from the first bottom source/drain region, and a second pull-up (PU) VTFET with a second bottom source/drain region and a fin projecting from the second bottom source/drain region. The fin of the first PU VTFET is arranged over a first active region in which the first bottom source/drain region is centrally arranged, and the fin of the second PU VTFET is arranged over a second active region in which the second bottom source/drain region is centrally arranged. The second source/drain region is aligned with the first bottom source/drain region. A read port may be connected with the storage element, and may also be formed using VTFETs.

9 Claims, 8 Drawing Sheets

(56) References Cited

U.S. PATENT DOCUMENTS

| | | | |
|---|---|---|---|
| 2013/0176771 A1* | 7/2013 | Chang | G11C 16/24 |
| | | | 365/154 |
| 2015/0318288 A1 | 11/2015 | Lim et al. | |
| 2017/0338233 A1* | 11/2017 | Huang | H01L 27/1104 |
| 2017/0373071 A1 | 12/2017 | Lim et al. | |
| 2018/0005691 A1* | 1/2018 | Liaw | G11C 11/412 |

OTHER PUBLICATIONS

Huynh-Bao et al., "Toward the 5nm Technology: Layout Optimization and Performance Benchmark for Logic/SRAMs Using Lateral and Vertical GAA FETs", Proc. SPIE 9781, Design-Process-Technology Co-optimization for Manufacturability X, 978102 (Mar. 16, 2016).

Na et al., "A New Compact SRAM Cell by Vertical MOSFET for Low-power and Stable Operation", 2011 3rd IEEE International Memory Workshop (IMW), Monterey, CA, 2011, pp. 1-4.

Paul et al., "Bitcell Layout for a Two-Port SRAM Cell Employing Vertical-Transport Field-Effect Transistors", U.S. Appl. No. 15/917,027, filed Mar. 9, 2018.

Zang et al., "Cross Couple Structure for Vertical Transistors", U.S. Appl. No. 15/856,205, filed Dec. 28, 2017.

Mann et al., "Novel Six-Transistor (6T) SRAM Cell Structure", U.S. Appl. No. 15/804,556, filed Nov. 6, 2017.

\* cited by examiner

STATIC RANDOM ACCESS MEMORY CELLS WITH ARRANGED VERTICAL-TRANSPORT FIELD-EFFECT TRANSISTORS

BACKGROUND

The present invention relates to semiconductor device fabrication and integrated circuits and, more specifically, to structures for a static random access memory bitcell and methods for forming a static random access memory bitcell.

Static random access memory (SRAM) may be used, for example, to temporarily store data in a computer system. When continuously powered, the memory state of an SRAM persists without the need for data refresh operations. An SRAM device includes an array of bitcells in which each bitcell retains a single bit of data during operation. Each SRAM bitcell may include a pair of cross-coupled inverters and a pair of access transistors connecting the inverters to complementary bit lines. The two access transistors are controlled by word lines, which are used to select the SRAM cell for read or write operations. A two-port SRAM is implemented by adding a read port that includes an additional pair of transistors. The addition of the transistor pair allows multiple read or write operations to occur concurrently or almost concurrently.

Device structures for a field-effect transistor generally include a source, a drain, and a gate electrode configured to switch carrier flow in a channel region arranged between the source and drain. The channel region of a planar field-effect transistor is located beneath the top surface of a substrate on which the gate electrode is supported. When a control voltage exceeding a designated threshold voltage is applied to the gate electrode, carrier flow occurs in the channel region to produce a device output current.

Planar field-effect transistors and fin-type field-effect transistors constitute a general category of field-effect transistor structures in which the direction of gated current in the channel region is in a horizontal direction parallel to the substrate surface. A vertical-transport field-effect transistor is a type of non-planar field-effect transistor in which the source and the drain are respectively arranged at the top and bottom of a semiconductor fin. The channel region of a vertical-transport field-effect transistor is arranged in the semiconductor fin between the source and the drain. The direction of gated current in the channel region of a vertical-transport field-effect transistor is in a vertical direction relative to the substrate surface and, therefore, in a direction that is parallel to the height of the semiconductor fin.

SUMMARY

In an embodiment, a structure includes a first active device region, a second active device region, and a storage element. The storage element includes a first pull-up (PU) vertical-transport field-effect transistor (VTFET) with a first bottom source/drain region centrally arranged in the first active device region and a fin projecting from the first bottom source/drain region, a first pull-down (PD) vertical-transport field-effect transistor (VTFET) with a fin projecting from the first active device region and lengthwise aligned in a first row with the fin of the first PU VTFET, a second pull-up (PU) vertical-transport field-effect transistor (VTFET) with a second bottom source/drain region arranged in the first active device region and a fin projecting from the second bottom source/drain region, and a second pull-down (PD) vertical-transport field-effect transistor (VTFET) with a fin projecting from the second active device region and lengthwise aligned in a second row with the fin of the second PU VTFET. The first source/drain region in the first active device region is aligned with the second source/drain region in the second active device region such that the first source/drain region and the second source/drain region are laterally arranged between the first PD VTFET and the second PD VTFET.

In an embodiment, a method includes forming a plurality of trench isolation regions in a substrate to define a first active device region and a second active device region arranged parallel with the first active device region, and implanting the first active device region and the second active device region with ions of a first conductivity type. An implantation mask is formed that covers a central section of the first active device region and a central section of the second active device region. After forming the implantation mask, the first active device region and the second active device region are implanted with ions of a second conductivity type to define a first source/drain region of the first conductivity type in the first active device region where covered by the implantation mask and a second source/drain region of the first conductivity type in the second active device region where covered by the implantation mask. The method further includes forming a first fin that projects from the first bottom source/drain region and a second fin that projects from the second bottom source/drain region. A first pull-up (PU) vertical-transport field-effect transistor (VTFET) is formed that includes the first fin and the first bottom source/drain region. A second pull-up (PU) vertical-transport field-effect transistor is formed that includes the second fin and the second bottom source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
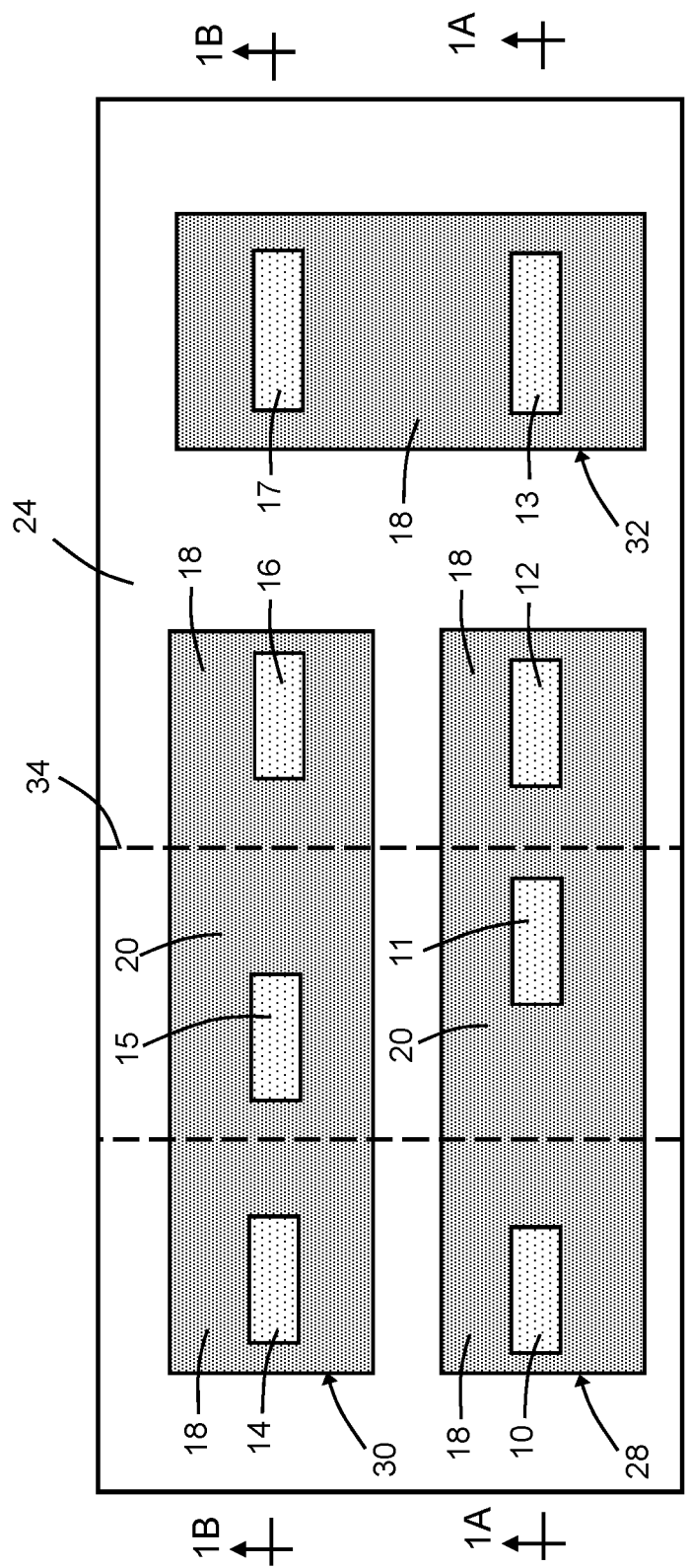
FIG. 1 is a top view of a structure at an initial fabrication stage of a processing method in accordance with embodiments of the invention.
Figure 1A:
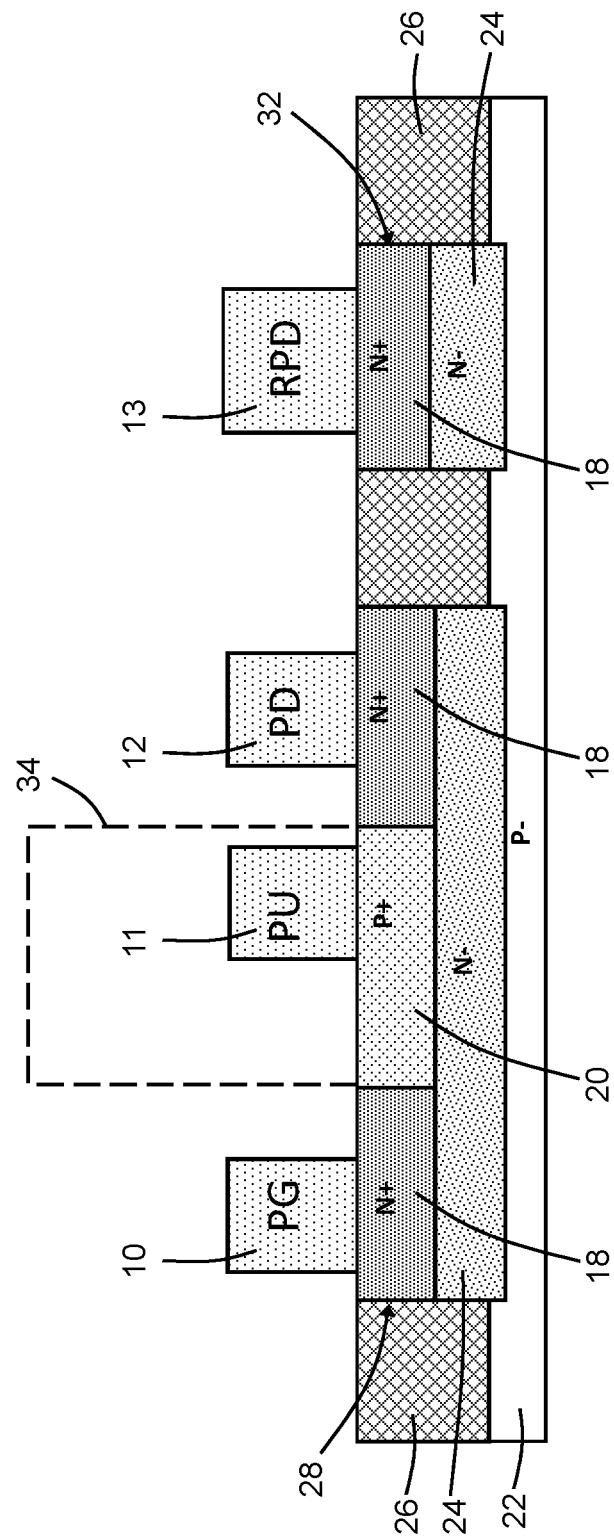
FIG. 1A is a cross-sectional view taken generally along line 1A-1A in FIG. 1.
Figure 1B:
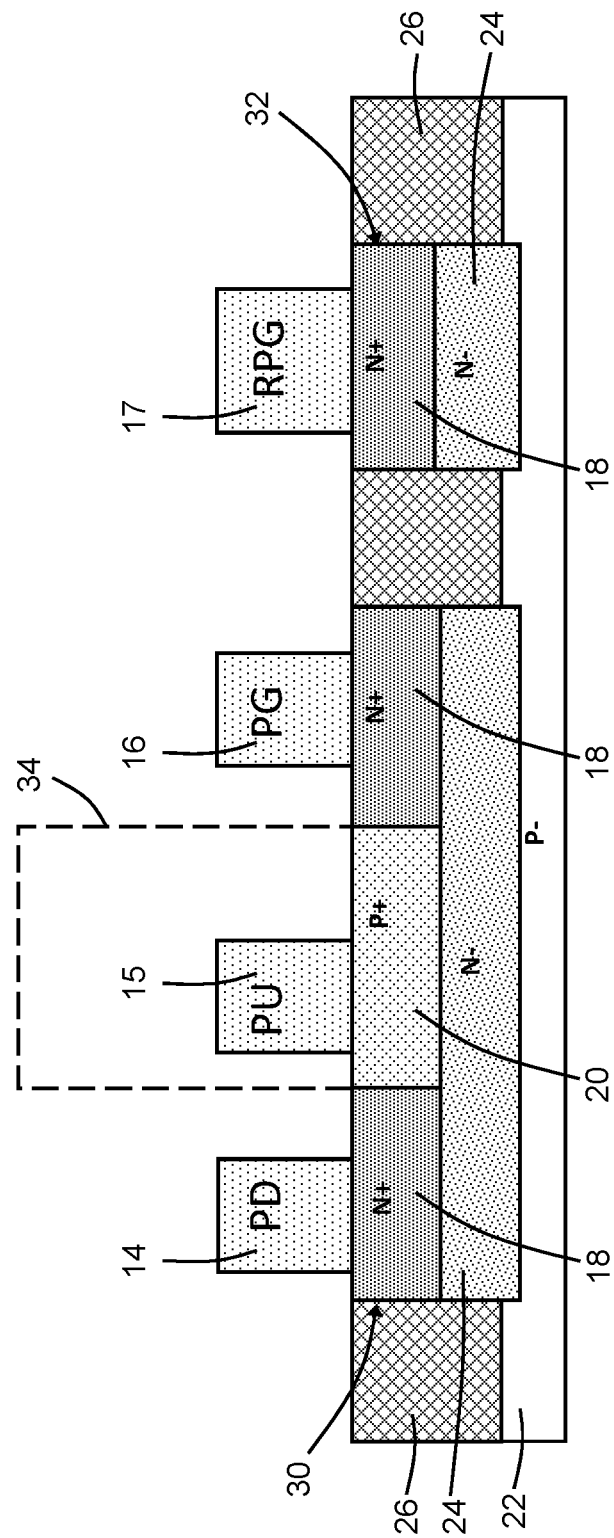
FIG. 1B is a cross-sectional view taken generally along line 1B-1B in FIG. 1.

With reference to FIGS. 1, 1A, 1B and in accordance with embodiments of the invention, multiple fins 10, 11, 12, 13, 14, 15, 16, and 17 project in a vertical direction relative to a top surface of a substrate 22. The fins 10, 12, 13, 14, 16, and 17 are arranged to extend vertically from one of multiple bottom source/drain regions 18, and the fins 11 and 15 are arranged to extend vertically from one of multiple bottom source/drain regions 20. As used herein, the term "source/drain region" connotes a doped region of semiconductor material that can function as either a source or a drain of a vertical-transport field-effect transistor. The substrate 22 may be lightly doped to have a given conductivity type, such as p-type conductivity. A portion of the substrate 22 may be doped over a given depth adjacent to the top surface of the substrate 22 to form a well 24. The well 24, which may be formed by ion implantation, may have an opposite conductivity type from the underlying substrate 22 and, in that regard, may be lightly doped to have n-type conductivity. The bottom source/drain regions 18, 20 are located at, and near, a top surface of a substrate 22.

Shallow trench isolation regions 26 are formed in the substrate 22 and operate to electrically isolate the different bottom source/drain regions 18, 20 from each other. The shallow trench isolation regions 26 may be formed with a lithography and etching process forming a pattern of trenches in the substrate 22, followed by filling the trenches with a dielectric material, such as an oxide of silicon (e.g., silicon dioxide ($SiO_2$)), deposited by chemical vapor deposition (CVD), planarization with chemical mechanical polishing (CMP), and recessing with a de-glaze process. The shallow trench isolation regions 26 surround sections of the substrate 22 to define active device regions 28, 30, 32.

The bottom source/drain regions 18 and the bottom source/drain regions 20 may be formed in the active device regions 28, 30, 32 by a series of ion implantations that dope the semiconductor material of the well 24 over a depth adjacent to the top surface of the substrate 22. The well 24 defines a tub in which the active device regions 28, 30, 32 are arranged. In active device region 28, one of the bottom source/drain regions 18 is arranged on side in juxtaposition with the bottom source/drain region 20 and another of the bottom source/drain regions 18 is arranged on an opposite side in juxtaposition with the bottom source/drain region 20. Similarly, in active device region 30, one of the bottom source/drain regions 18 is arranged on side in juxtaposition with the bottom source/drain region 20 and another of the bottom source/drain regions 18 is arranged on an opposite side in juxtaposition with the bottom source/drain region 20.

In connection with the formation of n-type vertical-transport field-effect transistors, the bottom source/drain regions 18 may contain an n-type dopant from Group V of the Periodic Table (e.g., phosphorus (P) and/or arsenic (As)) that provides n-type electrical conductivity. The bottom source/drain regions 18 are formed by implanting with ions delivering the n-type dopant under given implantation conditions (e.g., ion species, dose, kinetic energy, implantation angle). In connection with the formation of p-type vertical-transport field-effect transistors, the bottom source/drain regions 20 may contain a p-type dopant from Group V of the Periodic Table (e.g., boron (B) and/or indium (In)) that provides p-type electrical conductivity. The bottom source/drain regions 20 are formed by implanting with ions delivering the p-type dopant under given implantation conditions (e.g., ion species, dose, kinetic energy, implantation angle). An anneal may be used to activate and/or drive-in the dopants of the bottom source/drain regions 18, 20.

In an embodiment, the active device regions 28, 30, 32 may be implanted initially with ions of the p-type dopant either with or without an implantation mask. The implantation counterdopes the well 24 of the active device regions 28, 30, 32 to change its conductivity type from n-type to p-type. After the p-type ions are implanted and before the n-type ions are implanted, a implantation mask 34 is formed that covers a central section of the active device region 28, a central section of the active device region 30, and a section of one of the shallow trench isolation regions 26 is arranged laterally between the central sections of the active device region 28 and the active device region 30. The implantation mask 34 may include a layer of a light-sensitive material, such as an organic photoresist, applied by a spin coating process, pre-baked, exposed to light projected through a photomask, baked after exposure, and developed with a chemical developer. The implantation mask 34 may also include an anti-reflective coating and/or a spin-on hardmask, such as an organic planarization layer (OPL), that are patterned along with the photoresist. The implantation mask 34 is parameterized (e.g., thickness) to provide a stopping power sufficient to prevent the energetic n-type ions from penetrating into the covered central sections of the active device regions 28, 30 and altering their p-type conductivity. Areas of the active device regions 28, 30, 32 that are implanted with the n-type ions form the bottom source/drain regions 18, and areas of the active device regions 28, 30 covered by the implantation mask 34 form the bottom source/drain regions 20. The side edges of the bottom source/drain regions 20, which are juxtaposed with side edges of the bottom source/drain regions 18, are aligned with the side edges of the implantation mask 34.

The fins 10-17 may be formed from a semiconductor material, such as an epitaxial layer of semiconductor material grown on the substrate 22 after the bottom source/drain regions 18, 20 are formed. The fins 10-17 may be patterned from the layer of semiconductor material by lithography and etching, and cut into given lengths in the layout associated with the specific device structures being formed and their arrangement. Sections of a hardmask (not shown) composed of a dielectric material, such as silicon nitride ($Si_3N_4$), may be disposed on the top surfaces of the fins 10-17 as an artifact of the patterning process.

The fins 10-17 are used to construct different single-fin vertical-transport field-effect transistors (VTFETs) belonging to a two-port static random access memory (SRAM) as described hereinbelow. The fins 10, 11, 12 in the active device region 28 are aligned lengthwise in a row, and the fin 13 in the active device region 32 is lengthwise aligned with the fins 10, 11, 12 in that row. The fin 10 may be used to form a pass-gate (PG) VTFET for read or write operations, the fin 11 may be used to form a pull-up (PU) VTFET, and the fin 12 may be used to form a pull-down (PD) VTFET. The fin 11 used to form the PU VTFET is centrally arranged in the active device region 28 between the fin 10 used to form the PG VTFET and the fin 12 used to form the PD VTFET.

The fins 14, 15, 16 in the active device region 30 are also lengthwise aligned in a row, and the fin 17 in the active device region 32 is lengthwise aligned with the fins 14, 15, 16 in that row. The fin 14 may be used to form a pull-down (PD) VTFET, fin 15 may be used to form a pull-up (PU) VTFET, and fin 16 may be used to form a pass-gate (PG) VTFET for read or write operations. The fin 15 used to form the PU VTFET is centrally arranged in the active device region 30 between the fin 14 used to form the PD VTFET and the fin 16 used to form the PG VTFET. The fin 13, which is arranged at the end of the row including fins 10, 11, 12, may be used to form a read port pull-down (RPD) VTFET. The fin 17, which is arranged at the end of the row including fins 14, 15, 16, may be used to form a read port access (RPG) VTFET.

A two-port SRAM that may be formed using the fins 10-17 has a two contacted (poly) pitch (2CPP) structure relating to the arrangement of the subsequently-formed gates in association with the fins 10-17. The fins 10-13 are aligned along their respective lengths in a row, the fins 14-17 are aligned along their respective lengths in a row, and these rows are arranged parallel or substantially parallel to each other in the 2CPP structure. Because the implantation mask 34 is used to form the bottom source/drain regions 20, the bottom source/drain region 20 in active device region 28 and the bottom source/drain region 20 in active device region 30 are arranged in a column that crosses the row containing the fins 10-13 and crosses the row containing the fins 14-17.

Figure 2A:
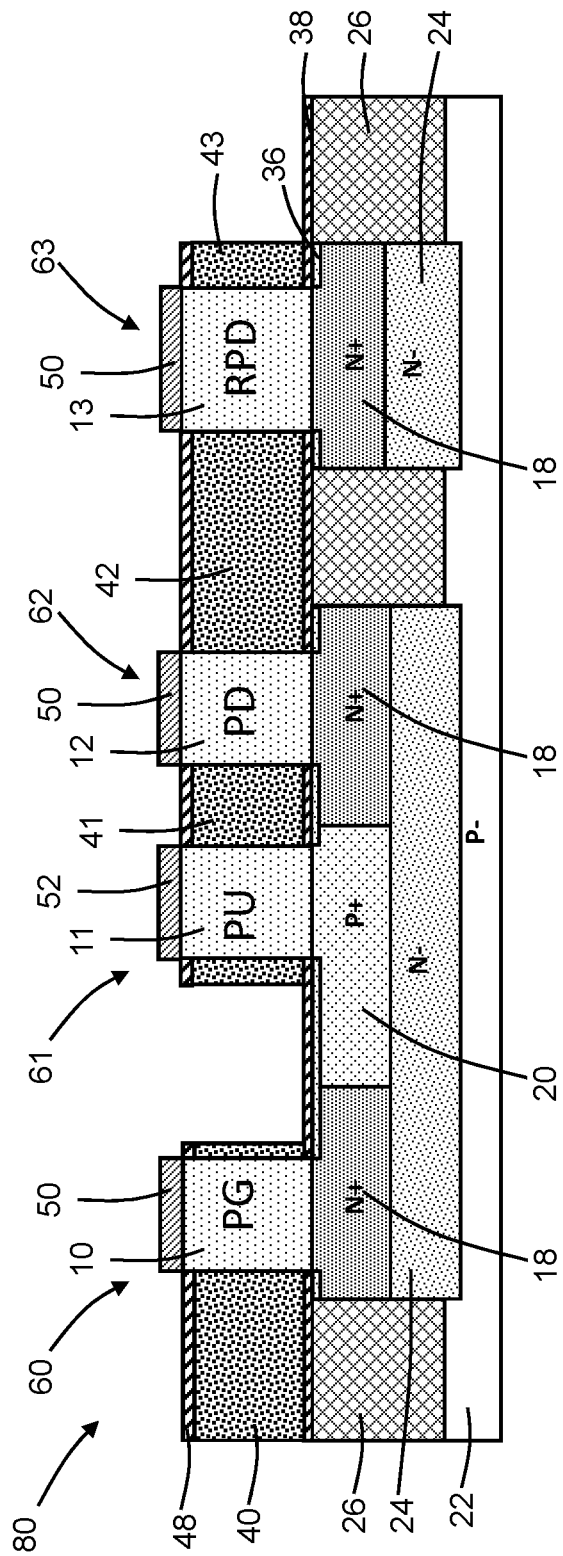
FIGS. 2A and 2B are cross-sectional views of the structure of FIGS. 1A, 1B at a fabrication stage of the processing method.
Figure 2B:
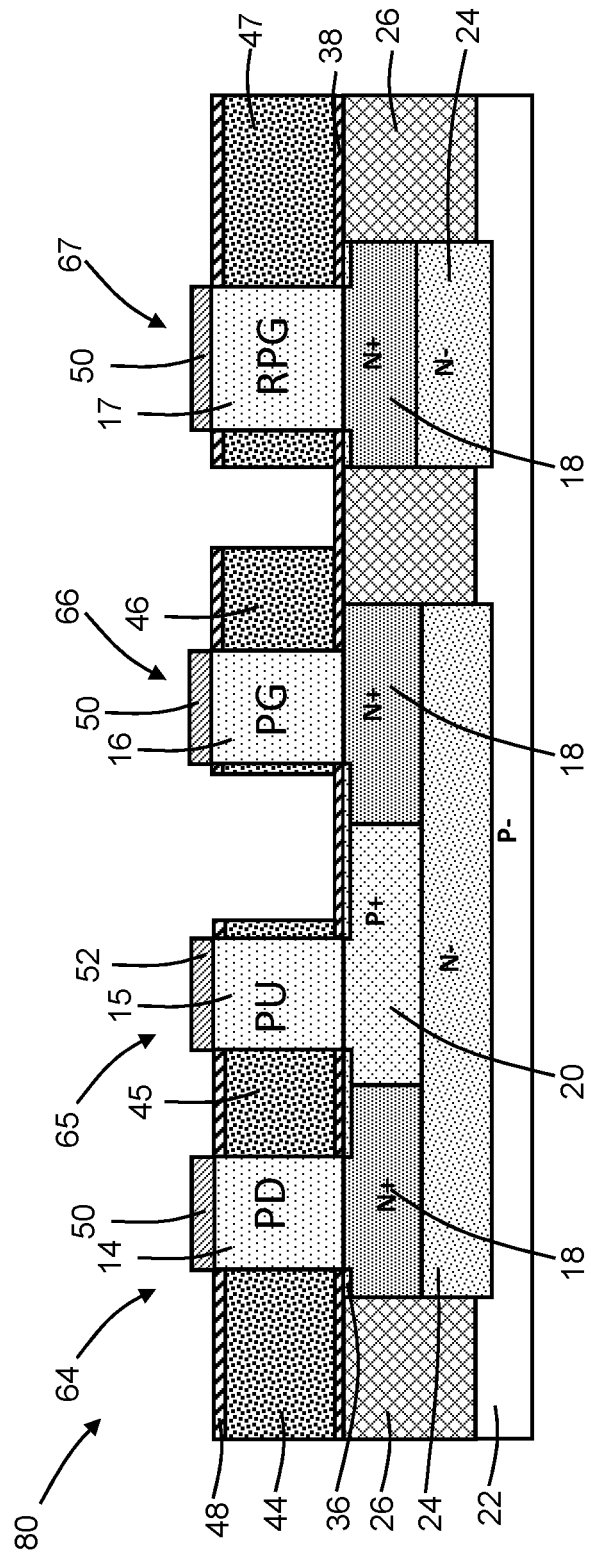

With reference to FIGS. 2A, 2B in which like reference numerals refer to like features in FIGS. 1A, 1B and at a subsequent fabrication stage, a silicide layer 36 may be formed in a self-aligned manner on the top surfaces of the active device regions 28, 30, 32. The silicide layer 36 may be formed by a self-aligned silicidation process that involves one or more annealing steps to form a silicide phase by reacting a deposited layer of silicide-forming metal and the semiconductor material of the active device regions 28, 30, 32 in contact with the deposited layer of silicide-forming metal. Unreacted metal, such as metal deposited on the shallow trench isolation regions 26, is stripped following formation of the silicide layer 36.

A bottom spacer layer 38 is arranged over the shallow trench isolation regions 26 and the bottom source/drain regions 18, 20. The bottom spacer layer 38 may be composed of a dielectric material, such as silicon nitride ($Si_3N_4$), that is deposited by a directional deposition technique, such as high-density plasma (HDP) deposition or gas cluster ion beam (GCIB) deposition. The fins 10-17 extend in the vertical direction through the thickness of the bottom spacer layer 38 and project to a given height above the bottom spacer layer 38. The silicide layer 36 is arranged between the bottom spacer layer 38 and the bottom source/drain regions 18, 20.

Gates 40, 41, 42, 43, 44, 45, 46, 47 are formed from a deposited gate stack and are arranged over the bottom spacer layer 38 in respective association with one of the fins 10-17. Each of the gates 40-47 surrounds all sides of a respective one of the fins 10-17 in a gate-all-around (GAA) arrangement. The gate stack used to form the gates 40-47 may include one or more conformal barrier metal layers and/or work function metal layers, such as layers composed of titanium aluminum carbide (TiAlC) and/or titanium nitride (TiN), and a metal gate fill layer composed of a conductor, such as tungsten (W). The layers of the gate stack may be serially deposited by, for example, atomic layer deposition (ALD), physical vapor deposition (PVD), or chemical vapor deposition (CVD), over the fins 10-17 and may be etched back by chamfering to a given thickness. A gate dielectric layer (not shown) is arranged between the gate stack and the fins 10-17. The gate dielectric layer may include a high-k dielectric material, such as a hafnium-based dielectric material like hafnium oxide ($HfO_2$) deposited by atomic layer deposition (ALD). The gate stack is patterned with lithography and etching to provide the gates 40-47, as well as gate extensions for connection with contacts and interconnects, gate extensions that provide cross-couplings between the gates 41, 42 and gates 44, 45 of each PU VTFET and PD VTFET pair, and a gate extension that couples the gate 42 of the PD VTFET with the gate 43 of the RPD VTFET.

Sections of a top spacer layer 48 are arranged about the fins 10-17 and over the gates 40-47. The top spacer layer 48 may be composed of a dielectric material, such as silicon nitride ($Si_3N_4$), that is deposited by a directional deposition technique, such as high-density plasma (HDP) deposition or gas cluster ion beam (GCIB) deposition. The sections of the top spacer layer 48 are present when the gate stack is etched to form the gates 40-47. The fins 10-17 extend in the vertical direction through the thickness of the top spacer layer 48.

Top source/drain regions 50 are formed on upper section of the fins 10, 12, 13, 14, 16, and 17, and are located over the top spacer layer 48. The top source/drain regions 50 may be composed of semiconductor material that is doped to have the same conductivity type as the bottom source/drain regions 18. If the bottom source/drain regions 18 have n-type conductivity, then the top source/drain regions 50 may be sections of semiconductor material formed by an epitaxial growth process with in-situ doping, and may contain an n-type dopant from Group V of the Periodic Table (e.g., phosphorus (P) and/or arsenic (As)) that provides n-type electrical conductivity.

Top source/drain regions 52 are formed on upper section of the fins 11 and 15, and are located over the top spacer layer 48. The top source/drain regions 52 may be composed of semiconductor material that is doped to have the same conductivity type as the bottom source/drain region 20. If the bottom source/drain regions 20 have p-type conductivity, then the top source/drain regions 52 may be sections of semiconductor material formed by an epitaxial growth process with in-situ doping, and may include a concentration of a p-type dopant from Group III of the Periodic Table (e.g., boron (B), aluminum (Al), gallium (Ga), and/or indium (In)) that provides p-type electrical conductivity.

In an embodiment, the top source/drain regions 50, 52 may be formed by respective selective epitaxial growth (SEG) processes in which the constituent semiconductor material nucleates for epitaxial growth on semiconductor surfaces (e.g., fins 10-17), but does not nucleate for epitaxial growth from insulator surfaces (e.g., the bottom spacer layer 38 and the top spacer layer 48).

The completed device structure is a two-port SRAM 80 that includes a storage element and a read port. The storage element of the two-port SRAM 80 includes a pass-gate (PG) vertical-transport field-effect transistor (VTFET) 60 comprising the fin 10 and the gate 40 wrapped about and surrounding the fin 10, a pull-up (PU) VTFET 61 comprising the fin 11 and the gate 41 wrapped about and surrounding the fin 11, and a pull-down (PD) VTFET 62 comprising the fin 12 and the gate 42 wrapped about and surrounding the fin 12. The storage element of the two-port SRAM 80 further includes a PD VTFET 64 comprising the fin 14 and the gate 44 wrapped about and surrounding the fin 14, a PU VTFET 65 comprising the fin 15 and the gate 45 wrapped about and surrounding the fin 15, and a PG VTFET 66 comprising the fin 16 and the gate 46 wrapped about and surrounding the fin 16. The read port of the two-port SRAM 80 includes a read port pull-down (RPD) VTFET 63 comprising the fin 13 and the gate 43 wrapped about and surrounding the fin 13, and a read port access (RPG) VTFET 67 comprising the fin 17 and the gate 47 wrapped about and surrounding the fin 17. The gates 40-47 are covered by the respective sections of the top spacer layer 48. The gate 41 of the PU VTFET 61 is integral with the gate 42 of the PD VTFET 62 to provide a cross-coupling characteristic of an inverter, the gate 44 of the PD VTFET 64 is integral with the gate 45 of the PU VTFET 65 to provide another cross-coupling characteristic of another inverter, and the gate 43 of the RPD VTFET 63 is also integral with the gate 42 of the PD VTFET 62 to connect the read port of the two-port SRAM 80 with the storage element of the two-port SRAM 80.

Figure 3A:
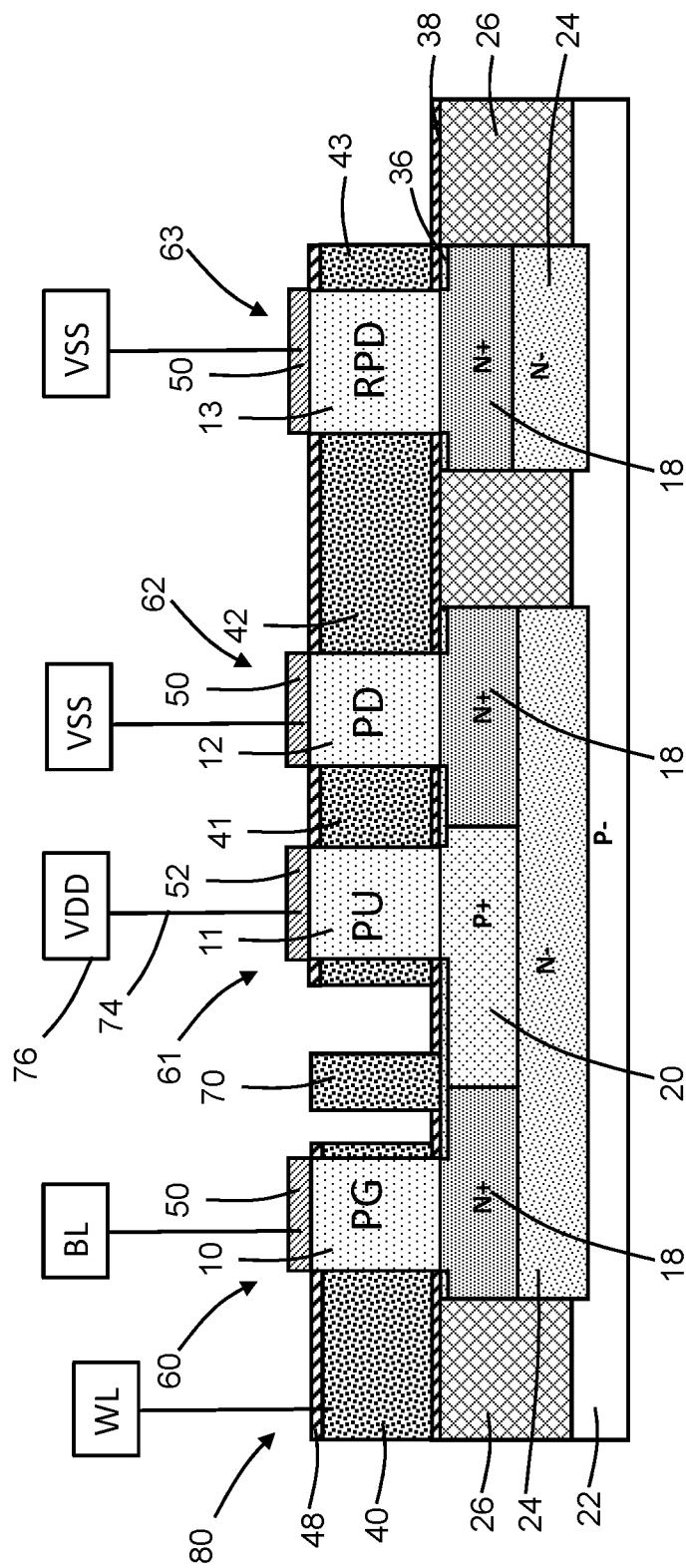
FIGS. 3A and 3B are cross-sectional views of the structure of FIGS. 2A, 2B at a fabrication stage of the processing method.
Figure 3B:
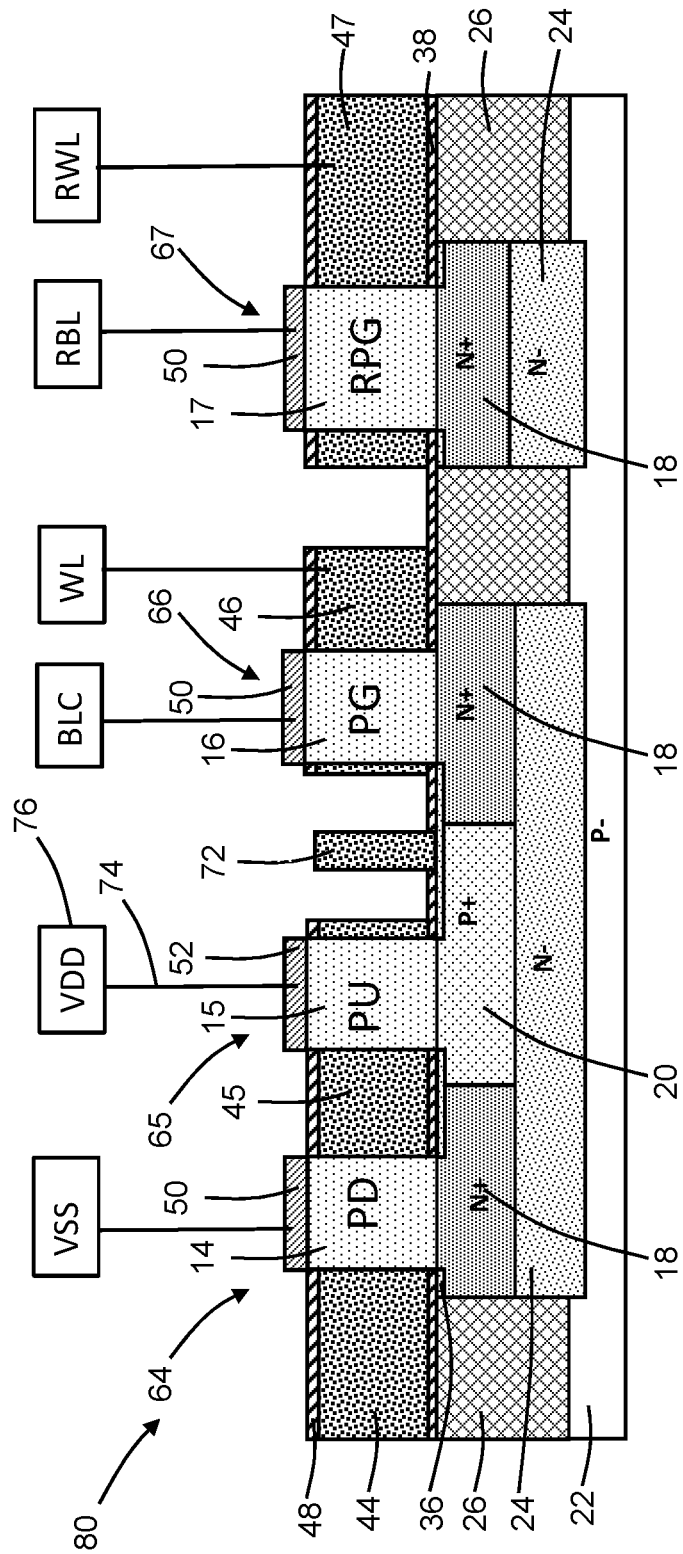

With reference to FIGS. 3A, 3B in which like reference numerals refer to like features in FIGS. 2A, 2B and at a subsequent fabrication stage, an interconnect structure is formed by middle-of-line (MOL) and back-end-of-line (BEOL) processing to provide connections to the structure for the two-port SRAM 80 including the VTFETs 60-67 after the VTFETs 60-67 that are formed by front-end-of-line (FEOL) processing. The top source/drain regions 50, 52 are used for signal and power routing in the two-port SRAM 80, and the bottom source/drain regions 18, 20 are used for cross-couple contacts in the two-port SRAM 80. The two-port SRAM 80 includes six VTFETs 60, 62, 63, 64, 66, and 67 of one conductivity type (e.g., n-type) and two VTFETs 61 and 65 of the complementary conductivity type (e.g., p-type).

The storage element of the two-port SRAM 80 includes the PU VTFET 61, the PD VTFET 62 that forms an inverter with the PU VTFET 61, as well as the PD VTFET 64, and the PU VTFET 65 that forms an inverter with the PD VTFET 64. These inverters are cross-coupled using the abutting bottom source/drain regions 18, 20 of the VTFETS 61, 62 and the connected gates 41, 42 of the VTFETs 61, 62, and using the abutting bottom source/drain regions 18, 20 of the VTFETS 64, 65 and the gates 54, 55 of the VTFETs 64, 65.

A true bit line (BL) is connected by one or more contacts with the top source/drain region 50 of the PG VTFET 60, which is the drain region of the PG VTFET 60 in the representative embodiment. The PG VTFET 60 couples the cross-coupled inverter formed by the PU VTFET 61 and PD VTFET 62 with the true bit line. A complementary bit line (BLC) is connected by one or more contacts with the top source/drain region 50 of the PG VTFET 66, which is the drain region of the PG VTFET 66 in the representative embodiment. The PG VTFET 66 couples the cross-coupled inverter formed by the PD VTFET 64 and PU VTFET 65 with the complementary bit line. A word line (WL) is connected by one or more contacts with the gate 40 of the PG VTFET 60 and with the gate 46 of the PG VTFET 66. The PG VTFET 60 and the gate 46 of the PG VTFET 66 represent access transistors controlled by the word line, which are used in part to select the two-port SRAM 80 for read or write operations by switching the connections of the inverters with the true bit line and the complementary bit line.

The top source/drain region 52 of the PU VTFET 61 and the top source/drain region 52 of the PU VTFET 65, which are source regions in the representative embodiment, are connected with a positive supply voltage ($V_{DD}$) line or another supply voltage line. In particular, because the PU VTFETs 61, 65 are centrally aligned in a column within the storage element, the positive supply voltage may be routed with a single interconnect wire 76, and the top source/drain region 52 of the PU VTFET 61 and the top source/drain region 52 of the PU VTFET 65 may be connected with by one or more contacts 74 at different positions along the length of the interconnect wire 76. The top source/drain region 50 of the PD VTFET 62 and the top source/drain region 50 of the PD VTFET 64, which are source regions in the representative embodiment, are connected by one or more contacts with a ground power supply ($V_{SS}$) line.

The read port of the two-port SRAM 80 includes the RPD VTFET 63 and the RPG VTFET 67. A read word line (RWL) is connected with the gate 47 of the RPG VTFET 67. A read bit line (RBL), which represents a data access line, is connected by one or more contacts with the top source/drain region 50 of the RPG VTFET 67, which is the drain of the RPG VTFET 67 in the representative embodiment. The top source/drain region 50 of the RPD VTFET 63, which is a source region in the representative embodiment, is connected by one or more contacts to the ground power supply ($V_{SS}$) line. The RPD VTFET 63 and the RPG VTFET 67 of the read port share the same bottom source/drain region 18 in common so that their drain regions are coupled together to provide an internal node connection within the two-port SRAM 80. The RPD VTFET 63 and the RPG VTFET 67 assist with read and write operations, and may allow multiple read or write operations to occur concurrently or almost concurrently.

The lines of the interconnect structure are arranged in one or more interlayer dielectric layers over the two-port SRAM 80, and include wires composed of a conductor that are formed in trenches defined in the one or more interlayer dielectric layers. The conductor may be composed of a metal, such as copper (Cu), cobalt (Co), ruthenium (Ru), or rhenium (Re) that is deposited by, for example, electroless or electrolytic deposition. The contacts of the interconnect structure are also arranged in the one or more interlayer dielectric layers, and may be composed of a conductor, such as tungsten (W).

The abutment of the bottom source/drain region 18 of the PD VTFET 62 with the bottom source/drain region 20 of the PU VTFET 61 along an interface couples their respective drains together in the representative embodiment. The bottom source/drain region 18 of the PD VTFET 62 and the bottom source/drain region 20 of the PU VTFET 61 are coupled by a local interconnect 70 with the gate 44 of the PD VTFET 64 and the gate 45 of the PU VTFET 65. Similarly, the abutment of the bottom source/drain region 18 of the PD VTFET 64 with the bottom source/drain region 20 of the PU VTFET 65 along an interface couples their respective drains together in the representative embodiment. The bottom source/drain region 18 of the PD VTFET 64 and the bottom source/drain region 20 of the PU VTFET 65 are coupled by a local interconnect 72 with the gate 41 of the PU VTFET 61 and the gate 42 of the PD VTFET 62. The local interconnects 70, 72 may be composed of trench silicide formed in association with MOL processing.

Figure 4:
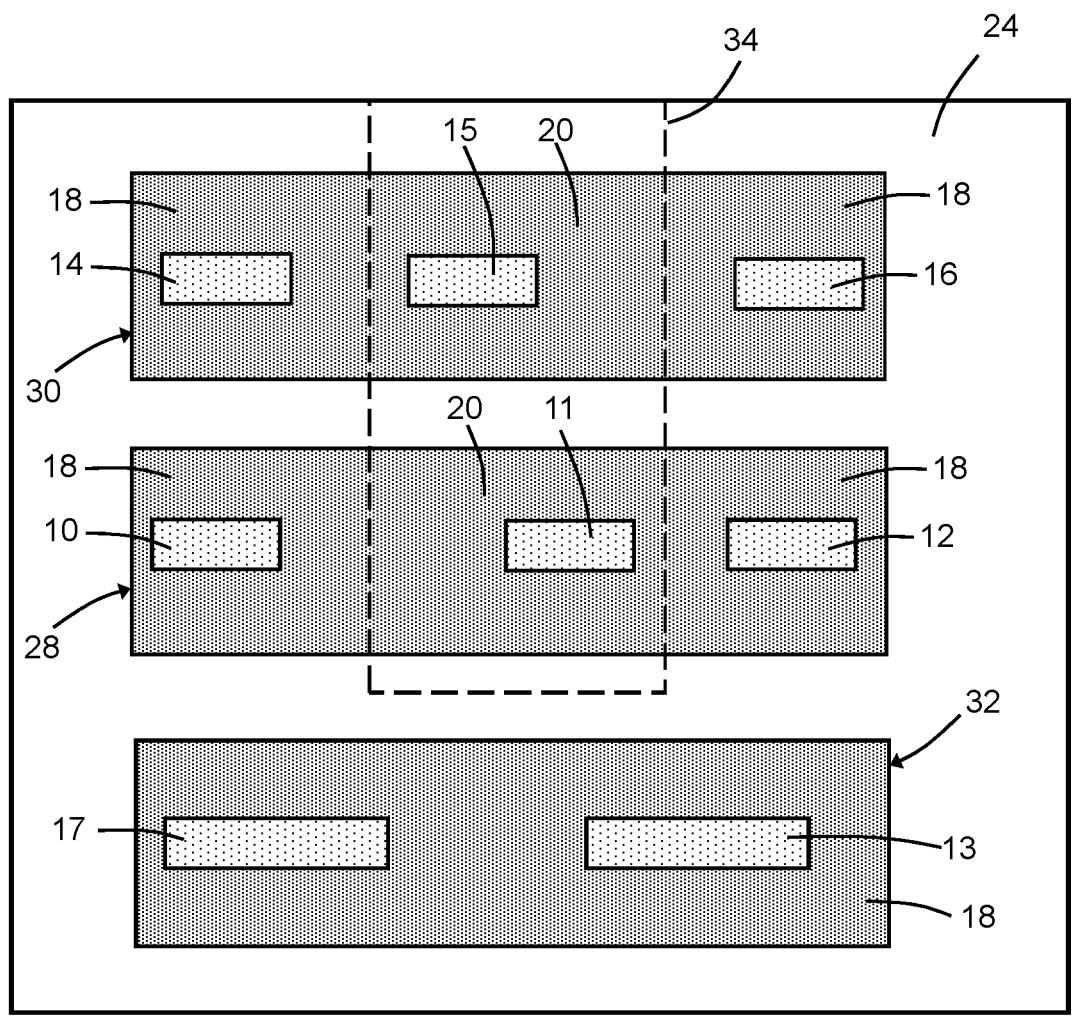
FIG. 4 is a top view similar to FIG. 1 of a structure at an initial fabrication stage of a processing method in accordance with alternative embodiments of the invention.

With reference to FIG. 4 in which like reference numerals refer to like features in FIG. 1 and in accordance with embodiments of the invention, the active device region 32 including the bottom source/drain region 18 and the fins 13, 17 may be rearranged relative to the other active device regions 28, 30. Specifically, the rearrangement may place the fins 13 and 17 used to form the read port of the two-port SRAM 80 in a separate row relative to the row containing the fins 10-12 and the row containing the fins 14-16. The active device region 32 is no longer arranged adjacent to one of the ends of the active device regions 28, 30. The multiple rows are arranged parallel or substantially parallel to each other in a 3CPP structure. As described above, the implantation mask 34 is used to form the bottom source/drain regions 20 that have a columnar alignment, and processing continues as described in FIGS. 2A, 2B and FIGS. 3A, 3B.

In an alternative embodiment, the processing method may be used to fabricate a six-transistor static random access memory (SRAM), instead of the two-port SRAM 80, in which the pull-up transistors are centrally located. In such an embodiment, the SRAM lacks the read port of the two-port SRAM 80, and only includes the storage element constructed from the PG VTFET 60, the PU VTFET 61, and the PD VTFET 62, as well as the PD VTFET 64, the PU VTFET 65, and the PG VTFET 66.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

References herein to terms modified by language of approximation, such as "about," "approximately," and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first active device region;
a second active device region;
a storage element including a first pull-up (PU) vertical-transport field-effect transistor (VTFET) with a first bottom source/drain region centrally arranged in the first active device region and a fin projecting from the first bottom source/drain region, a first pull-down (PD) vertical-transport field-effect transistor (VTFET) with a fin projecting from the first active device region and aligned lengthwise in a first row with the fin of the first PU VTFET, a second pull-up (PU) vertical-transport field-effect transistor (VTFET) with a second bottom source/drain region centrally arranged in the second active device region and a fin projecting from the second bottom source/drain region, and a second pull-down (PD) vertical-transport field-effect transistor (VTFET) with a fin projecting from the second active device region and aligned lengthwise in a second row with the fin of the second PU VTFET; and a read port including a read port access (RPG) vertical-transport field-effect transistor (VTFET) and a read port pull-down (RPD) vertical-transport field-effect transistor (VTFET), coupled with the first PD VTFET of the storage element, the RPD VTFET including a fin and the RPG VTFET including a fin that is lengthwise aligned in a third row with the fin of the RPD VTFET,
wherein the first bottom source/drain region of the first PU VTFET in the first active device region is aligned with the second bottom source/drain region of the second PU VTFET in the second active device region such that the first bottom source/drain region and the second bottom source/drain region are laterally arranged between the first PD VTFET and the second PD VTFET, the first row, the second row, and the third row are spaced apart from each other, the first row is arranged parallel with the second row, and the third row is arranged parallel with the second row.

2. The structure of claim 1 wherein the first row is arranged between the second row and the third row.

3. The structure of claim 1 further comprising:
a first pass-gate (PG) vertical-transport field-effect transistor (VTFET) including a fin that is aligned lengthwise in the first row with the fin of the first PU VTFET and the fin of the first PD VTFET,
wherein the fin of the first PU VTFET is arranged in the first active device region laterally between the fin of the first PG VTFET and the fin of the first PD VTFET.

4. The structure of claim 3 further comprising:
a second pass-gate (PG) vertical-transport field-effect transistor (VTFET) with a fin that is aligned lengthwise in the second row with the fin of the second PU VTFET and the fin of the second PD VTFET,
wherein the fin of the second PU VTFET is arranged in the first active device region laterally between the fin of the second PG VTFET and the fin of the second PD VTFET.

5. The structure of claim 3 wherein the first bottom source/drain region of the first PU VTFET has a first conductivity type, the first active device region includes a third bottom source/drain region of a second conductivity type and the fin of the first PD VTFET projects from the third bottom source/drain region, the first active device region includes a fourth bottom source/drain region of the second conductivity type and the fin of the first PG VTFET projects from the fourth bottom source/drain region, and the first bottom source/drain region is arranged in the first active device region laterally between the third bottom source/drain region and the fourth bottom source/drain region.

6. The structure of claim 5 wherein the first bottom source/drain region of the first PU VTFET and the second bottom source/drain region of the second PU VTFET are comprised of a first semiconductor material having p-type conductivity, and the third bottom source/drain region of the first PD VTFET and the fourth bottom source/drain region of the second PD VTFET are comprised of a second semiconductor material having n-type conductivity.

7. The structure of claim 1 further comprising:
a trench isolation region arranged between the first bottom source/drain region of the first PU VTFET in the first active device region and the second bottom source/drain region of the second PU VTFET in the second active device region.

8. The structure of claim 1 wherein the first bottom source/drain region of the first PU VTFET and the second bottom source/drain region of the second PU VTFET are comprised of a semiconductor material having p-type conductivity.

9. The structure of claim 1 wherein the first PU VTFET includes a first top source/drain region, the second PU VTFET includes a second top source/drain region, and the structure further comprises:

an interconnect structure including an interconnect coupled with a power supply voltage, a first contact connecting the interconnect with the first top source/drain region, and a second contact connecting the interconnect with the second top source/drain region.

* * * * *